US008546852B2

(12) United States Patent
Takagi

(10) Patent No.: US 8,546,852 B2
(45) Date of Patent: Oct. 1, 2013

(54) SEMICONDUCTOR DEVICE

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 490 days.

(21) Appl. No.: 12/259,566

(22) Filed: Oct. 28, 2008

(65) Prior Publication Data
US 2009/0108298 A1   Apr. 30, 2009

(30) Foreign Application Priority Data

Oct. 31, 2007   (JP) ................. P2007-282942

(51) Int. Cl.
*H01L 29/80* (2006.01)

(52) U.S. Cl.
USPC .......... 257/213; 257/194; 257/281; 257/283; 257/330; 257/E29.246; 257/E29.252; 257/E21.407; 257/280; 438/167; 438/172

(58) Field of Classification Search
USPC .................. 257/192, 194, E21.403, E21.407, 257/E29.246, E29.252, 213, 280, 281, 283, 257/330; 438/167, 172
See application file for complete search history.

(56) References Cited

U.S. PATENT DOCUMENTS

| 4,313,124 | A | 1/1982 | Hara |
| 4,313,126 | A | 1/1982 | Krumm et al. |
| 6,713,793 | B1 | 3/2004 | Suzuki et al. |
| 7,135,747 | B2 | 11/2006 | Allen et al. |
| 2003/0168699 | A1 | 9/2003 | Honda |
| 2006/0065912 | A1 | 3/2006 | Beach |
| 2007/0066020 | A1 | 3/2007 | Beach |
| 2007/0102726 | A1* | 5/2007 | Watanabe et al. ............. 257/194 |
| 2007/0145415 | A1 | 6/2007 | Inoue et al. |
| 2007/0202360 | A1 | 8/2007 | Chaudhari et al. |

FOREIGN PATENT DOCUMENTS

| DE | 103 01 939 A1 | 9/2004 |
| JP | 49-40484 | 4/1974 |
| JP | 57-160148 | 10/1982 |
| JP | 63-175481 | 7/1988 |
| JP | 2-288409 | 11/1990 |
| JP | 8-203923 | 8/1996 |
| JP | 8-213409 | 8/1996 |
| JP | 10-189618 | 7/1998 |

(Continued)

OTHER PUBLICATIONS

Office Action issued on Aug. 25, 2010 in Korean Patent Application No. 10-2008-106889 (with English translation).

(Continued)

*Primary Examiner* — Daniel Whalen
*Assistant Examiner* — Suberr Chi
(74) *Attorney, Agent, or Firm* — Oblon, Spivak, McClelland, Maier & Neustadt, L.L.P.

(57) ABSTRACT

A semiconductor device includes: substrate region; a gate electrode, a source electrode, and a drain electrode which are placed on a first surface of the substrate regions; an active area between gate and source placed between the gate electrode and the source electrode; an active area between gate and drain placed between the gate electrode and the drain electrode; an active area placed on the substrate region of the underneath part of the gate electrode, the source electrode, and the drain electrode; and a non-active area placed adjoining the active area, the active area between gate and source, and the active area between gate and drain. Furthermore, width $W_{A1}$ of the active area between gate and source is wider than width $W_{A2}$ of the active area between gate and drain. Channel resistance of an active area between source and gate placed between a gate electrode and a source electrode is reduced, and high-frequency performance is provided.

12 Claims, 14 Drawing Sheets

(56) References Cited

FOREIGN PATENT DOCUMENTS

| | | |
|---|---|---|
| JP | 2001-28425 | 1/2001 |
| JP | 2007-173556 | 7/2007 |
| JP | 2007-243018 | 9/2007 |
| JP | 2007-266475 | 10/2007 |
| KR | 10-2006-0110002 | 10/2006 |

OTHER PUBLICATIONS

Office Action issued Feb. 1, 2011, in Japanese Patent Application 2007-282942 with English translation.

Taiwanese Office Action issued Nov. 20, 2012, in Taiwan Patent Application No. 097141638 (with English translation).

* cited by examiner

US 8,546,852 B2

SEMICONDUCTOR DEVICE

CROSS REFERENCE TO RELATED APPLICATION AND INCORPORATION BY REFERENCE

This application is based upon and claims the benefit of priority from prior Japanese Patent Application No. P2007-282942 filed on Oct. 31, 2007, the entire contents of which are incorporated herein by reference.

BACKGROUND OF THE INVENTION

1. Field of the Invention

The present invention relates to a semiconductor device used with a high frequency band, and in particular relates to a semiconductor device of planar structure which reduces channel resistance using a semiconducting material with a high electric field which reaches saturation electron velocity, such as GaN.

2. Description of the Related Art

A semiconductor device used with a high frequency band, for example, a microwave power amplifying device, is composed of active elements, such as a field effect type transistor, passive elements, such as a resistance and a capacitor, and circuit elements, such as a microstrip lines for transmitting a high frequency signal.

These circuit elements are formed, for example on a semi-insulating substrate. An electrode for grounding is formed on a backside of the semi-insulating substrate. And, when grounding the circuit element, the electrode for grounding formed on the backside of the semi-insulating substrate is electrically connected with the circuit element provided on the semi-insulating substrate through a VIA hole (via hole) which passes through the semi-insulating substrate, for example (for example, refer to Patent Document 1 and Patent Documents 2).

A semiconductor device provided with a plurality of active areas selectively formed on a semi insulating semiconductor substrate is already disclosed (for example, refer to Patent Document 3).

A semiconductor device which expands a thermal diffusion path and reduces thermal resistance by dividing an active layer region by an isolation region formed in the direction perpendicular to a gate electrode finger is already disclosed (for example, refer to Patent Document 4).

A high frequency high power semiconductor device provided with a thermal spacer which divides at least one unit cell into a first active area (active portion) and a second active area (active portion), which the first active area and the second active area which are formed selectively are offset and are placed for thermal diffusion is already disclosed (for example, refer to Patent Document 5).

FIG. 1 shows a semiconductor device according to a conventional example, FIG. 1A shows its schematic section structure chart, and FIG. 1B shows its schematic plane pattern configuration diagram.

As shown in FIG. 1, the semiconductor device according to the conventional example, for example, includes: a substrate 10; a GaN epitaxial growth layer 12 placed on the substrate 10; an AlGaN layer 18 placed on the GaN epitaxial growth layer 12; a source electrode 20 and a drain electrode 22 which are placed on the AlGaN layer 18; a gate electrode 24 placed at a recess part on the AlGaN layer 18; and a non-active area (isolation region) 14 formed on a part of the AlGaN layer 18 and the GaN epitaxial growth layer 12. A 2DEG (Two Dimensional Electron Gas) layer 16 is formed on an interface with the AlGaN layer 18 on the GaN epitaxial growth layer 12. The semiconductor device shown in FIG. 1 is equivalent to HEMT (High Electron Mobility Transistor).

In the semiconductor device according to the conventional example, as shown in FIG. 1, in order to reduce a value of resistance of a source resistance Rs which is a channel resistance between the source electrode 20 and the gate electrode 24, the thickness of the AlGaN layer 18 directly underneath of the source electrode 20 is set up thicker than the thickness of the AlGaN layer 18 directly underneath of the gate electrode 24. On the other hand, in order to improve the controllability of gate voltage applied to the gate electrode 24, the thickness of the AlGaN layer 18 directly underneath of the gate electrode 24 is set up thinner.

By reducing the source resistance $R_s$, the ON resistance can be reduced and the rising characteristics of the drain current $I_D$ can be improved in drain current $I_D$ versus drain-source voltage $V_{DS}$ characteristics.

In the semiconductor device according to the conventional example, as shown in FIG. 1, width $W_{A1}$ of an active area 30 ($AA_1$) between gate and source placed between the source electrode 20 and the gate electrode 24 and width $W_{A2}$ of an active area 32 ($AA_2$) between gate and drain placed between the gate electrode 24 and the drain electrode 22 are designed to be equal.

FIG. 2 shows a schematic plane pattern configuration of a semiconductor device according to a conventional example, FIG. 2A shows a schematic plane pattern configuration diagram of a unit element, FIG. 2B shows a schematic plane pattern configuration diagram of the semiconductor device which extends channel width of the unit element, and FIG. 2C shows a schematic plane pattern configuration diagram of the semiconductor device which turned up the semiconductor device shown in FIG. 2B in the source/drain direction of centering on a drain electrode.

In the semiconductor device according to the conventional example, also in the extended device structure as shown in FIG. 2A to FIG. 2C, as well as in FIG. 1, width of an active area 30 ($AA_1$) between gate and source placed between a source electrode 20 and a gate electrode 24 and width of an active area 32 ($AA_2$) between gate and drain placed between the gate electrode 24 and a drain electrode 22 are designed to be equal.

Moreover, FIG. 3 shows a schematic plane pattern configuration of a semiconductor device according to a conventional example, FIG. 3A shows an enlarged drawing of a part of reference numeral A of FIG. 3B, and FIG. 3B shows an overall schematic plane pattern configuration diagram.

As shown in FIG. 3, the overall schematic plane pattern configuration of the semiconductor device according to the conventional example includes: a substrate 100; a gate electrode 24, a source electrode 20, and a drain electrode 22 which are placed on a first surface of the substrate 100 and have a plurality of fingers, respectively; a gate terminal electrode 240, a source terminal electrode 200, and a drain terminal electrode 220 which are placed on the first surface of the substrate 100, and make bundles of a plurality of fingers and are formed, respectively every the gate electrode 24, the source electrode 20, and the drain electrode 22; an active area 30 between gate and source placed between the gate electrode 24 and the source electrode 20; an active area 32 between gate and drain placed between the gate electrode 24 and the drain electrode 22; and a VIA hole 260 connected to the source terminal electrode 200, wherein width of the active area 30 between gate and source is equal to width of the active area 32 between gate and drain.

In a configuration example of FIG. 3, as for the size of each part, for example, cell width W1 is about 120 micrometers, W2 is about 80 micrometers, cell length W3 is about 100 micrometers, W4 is about 120 micrometers, and gate width WG is about 2.4 mm (=100 micrometer×6×4 cells) as a whole.

In the example of FIG. 3, in the source terminal electrodes 200, the VIA holes 260 are formed from a backside of the substrate 100, and a ground conductor is formed on the backside of the substrate 100. And, when grounding the circuit element, the circuit element provided on the substrate 100 and the ground conductor formed on the backside of the substrate 100 are electrically connected through the VIA holes 260 which pass through the substrate 100.

In addition, the gate terminal electrodes 240 are connected to surrounding circuit elements by bonding wires etc., and the drain terminal electrode 220 is also connected to surrounding circuit elements by bonding wires etc.

In the conventional semiconductor device, since an electric field of the active area 30 placed between the source electrode 20 and the gate electrode 24 is lower than an electric field of the active area 32 placed between the gate electrode 24 and the drain electrode 22, the value of electron velocity in the active area 30 placed between the source electrode 20 and the gate electrode 24 is low. Since the value of the electron velocity is low, the value of channel resistance is increased, and as the result, high frequency characteristics are degraded.

Patent Document 1:
Japanese Patent Application Laying-Open Publication No. H02-288409
Patent Document 2:
Japanese Patent Application Laying-Open Publication No. 2001-28425
Patent Document 3:
Japanese Patent Application Laying-Open Publication No. S57-160148 (Pages 2 to 3, and FIG. 5)
Patent Document 4:
Japanese Patent Application Laying-Open Publication No. H08-213409 (Page 3 and FIG. 1)
Patent Document 5:
U.S. Patent Publication No. 7,135,747 (Page 6 and FIG. 2)

SUMMARY OF THE INVENTION

According to an aspect of the invention, a semiconductor device comprises a substrate region; a gate electrode, a source electrode and a drain electrode which are placed on a first surface of the substrate region; an active area placed between the gate electrode and the source electrode; an active area placed between the gate electrode and the drain inter-electrode; an active area placed on the substrate of the underneath part of the gate electrode, the source electrode, and the drain electrode; and a non-active area placed adjoining the active area, the active area between gate and source, and the active area between gate and drain. Width of the active area between gate and sources is wider than width of the active area between gate and drain.

According to another aspect of the invention, a semiconductor device comprises a substrate region; a gate electrode, a source electrode, and a drain electrode which are placed on a first surface of the substrate region, and have a plurality of fingers, respectively; a gate terminal electrode, a source terminal electrode, and a drain terminal electrode which are placed on the first surface of the substrate region, and make bundles of a plurality of fingers and are formed, respectively for every the gate electrode, the source electrode, and the drain electrode; an active area placed between the gate electrode and the source electrode; an active area placed between the gate electrode and the drain electrode; an active area placed on the substrate of a underneath part of the gate electrode, the source electrode, and the drain electrode; a non-active area placed adjoining the active area, the active area between gate and source, and the active area between gate and drain; and a via hole connected to the source terminal electrode. Width of the active area between gate and source is wider than width of the active area between gate and drain.

The substrate region includes a heterojunction epitaxial layer composed of GaN/AlGaN.

The substrate region includes a GaN epitaxial layer, and the active area placed on the substrate region of the underneath part of the source electrode and the drain electrode is composed of a source diffusion region and a drain diffusion region, respectively.

The substrate region has either a SiC substrate, a GaN substrate, a substrate in which a GaN epitaxial layer is formed on a SiC substrate, a substrate in which a GaN epitaxial layer is formed on an Si substrate, a substrate in which a heterojunction epitaxial layer composed of GaN/AlGaN is formed on a SiC substrate, a substrate in which a GaN epitaxial layer is formed on a sapphire substrate, a sapphire substrate, or a diamond substrate.

According to the present invention, a semiconductor device which can suppress an increase in channel resistance can be provided.

Moreover, according to the present invention, channel resistance of an active area placed between the gate electrode and the source electrode is reduced, and as the result, a semiconductor device which has high frequency characteristics can be provided.

Moreover, according to the present invention, a semiconductor device which can alleviate electric field concentrations can be provided by reducing discontinuity of width of the active area between source and gate and/or the active area between drain and gate.

DETAILED DESCRIPTION OF THE EMBODIMENTS

Figure 1A:
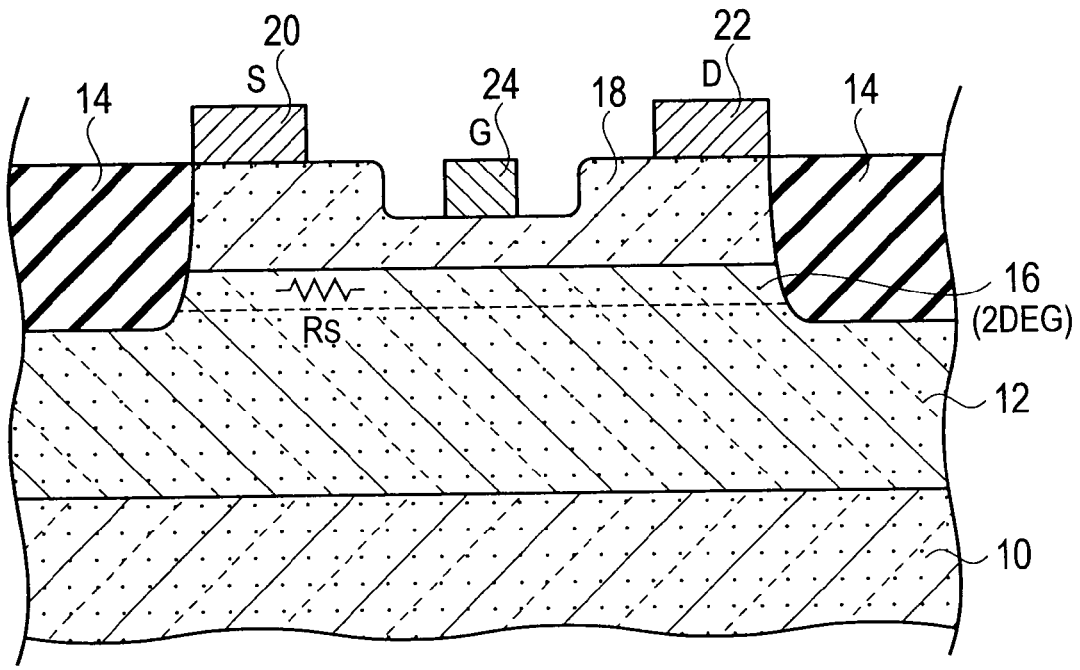
FIG. 1A shows a semiconductor device according to a conventional example, and is a schematic section structure chart.
Figure 1B:
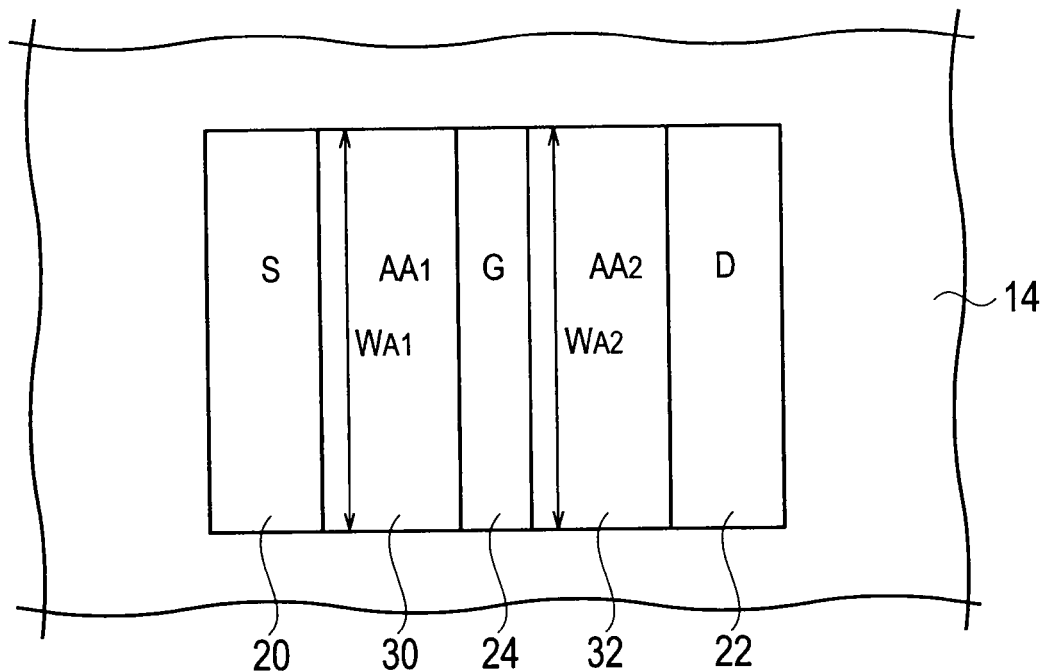
FIG. 1B shows the semiconductor device according to the conventional example, and is a schematic plane pattern configuration diagram.
Figure 2A:
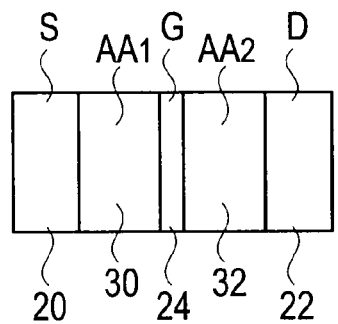
FIG. 2A shows a schematic plane pattern configuration of a semiconductor device according to a conventional example, and is a schematic plane pattern configuration diagram of a unit element.
Figure 2B:
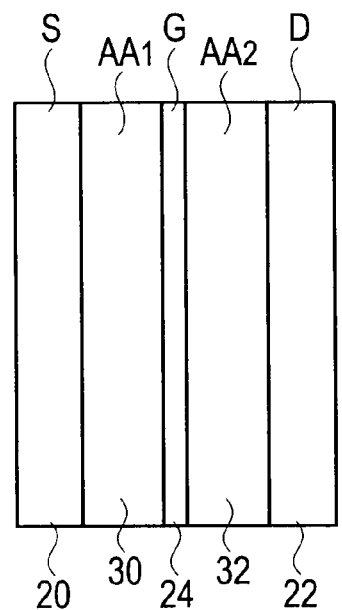
FIG. 2B shows a schematic plane pattern configuration of the semiconductor device according to the conventional example, and is a schematic plane pattern configuration diagram showing a semiconductor device which extends channel width of the unit element.
Figure 2C:
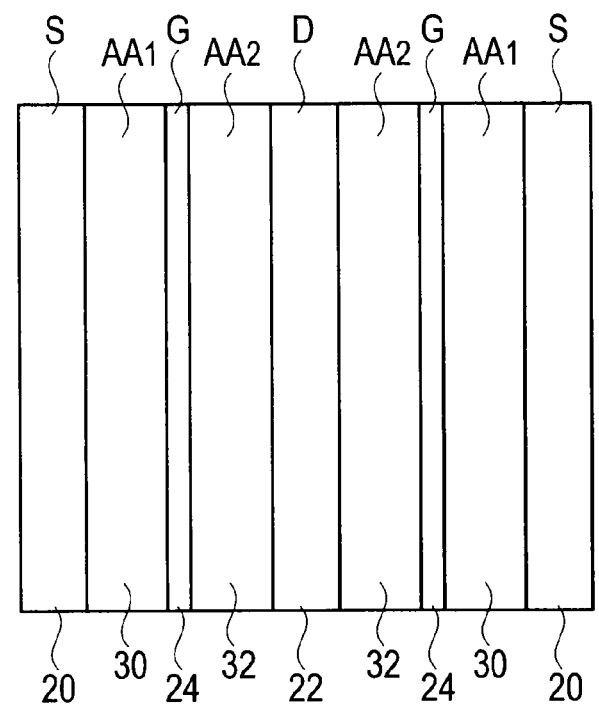
FIG. 2C shows a schematic plane pattern configuration of the semiconductor device according to the conventional example, and is a schematic plane pattern configuration diagram showing a semiconductor device which turned up the semiconductor device of FIG. 2B in the source/drain direction of centering on a drain electrode.
Figure 3A:
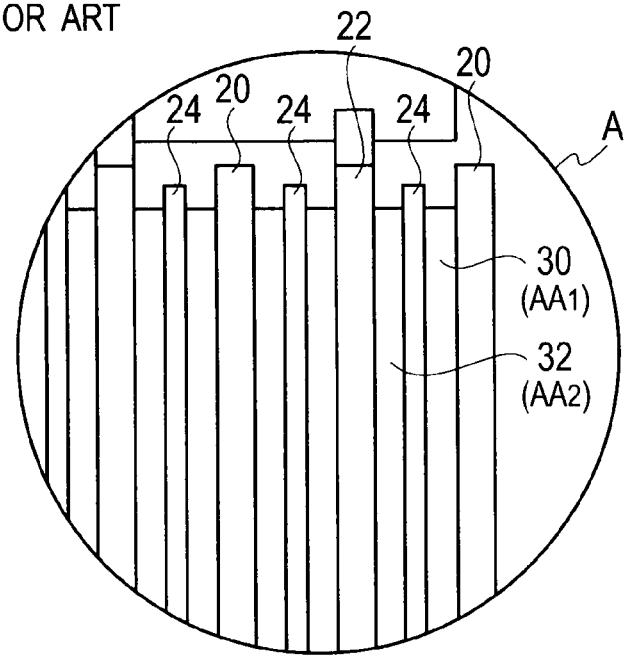
FIG. 3A shows a schematic plane pattern configuration of a semiconductor device according to a conventional example, and is an enlarged drawing showing a part of reference symbol A of FIG. 3B.
Figure 3B:
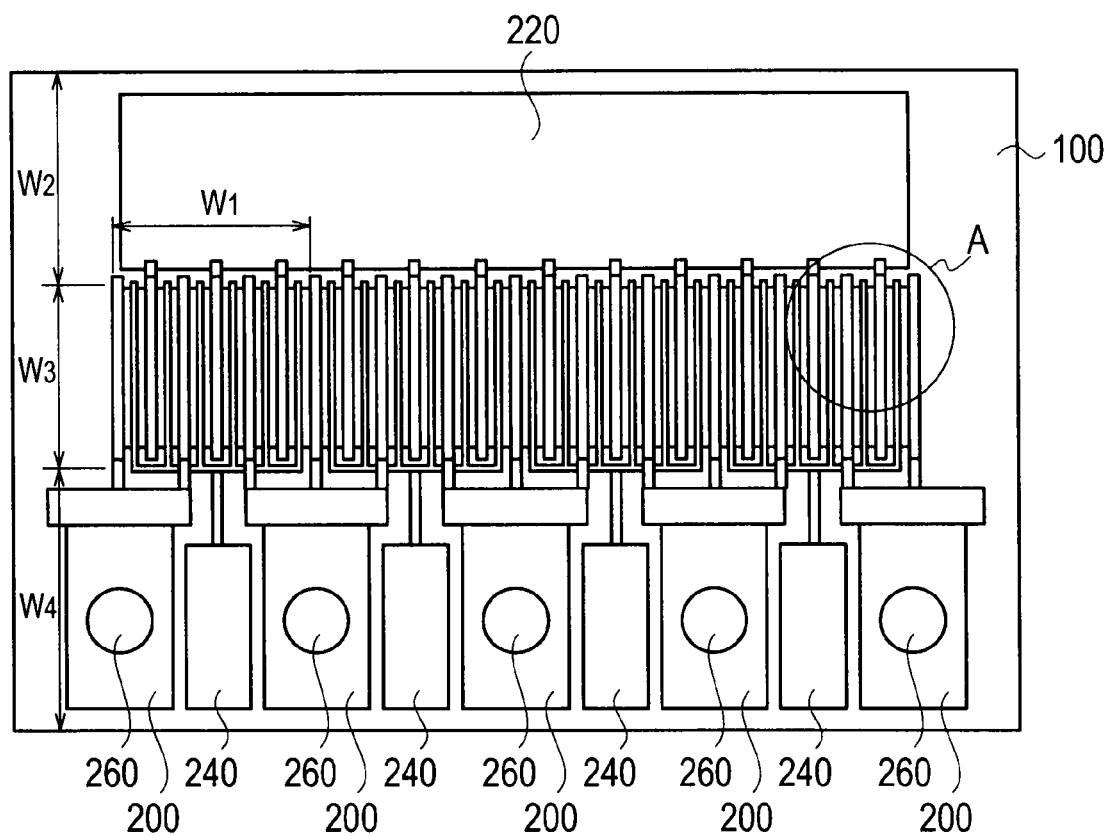
FIG. 3B shows a schematic plane pattern configuration of the semiconductor device according to the conventional example, and is an overall schematic plane pattern configuration diagram.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

First Embodiment

Electric Field Dependency of Electron Velocity

Since effective mass of electron in GaN is 0.19 $m_0$ and is an about 3 times large as compared with effective mass of electron in GaAs, the value of electron mobility in GaN in the low electric field region is small as compared with the case of GaAs. At this point, $m_0$ denotes electron rest mass. Also in HEMT structure without impurity scattering, the value of electron mobility in GaN in the low electric field region is about 1000 to 1500 $cm^2/V \cdot s$ at room temperature. However, deciding speed performance of HEMT in a real operational state, where a high electric field is applied, has electron velocity more dominant than electron mobility.

Figure 4:
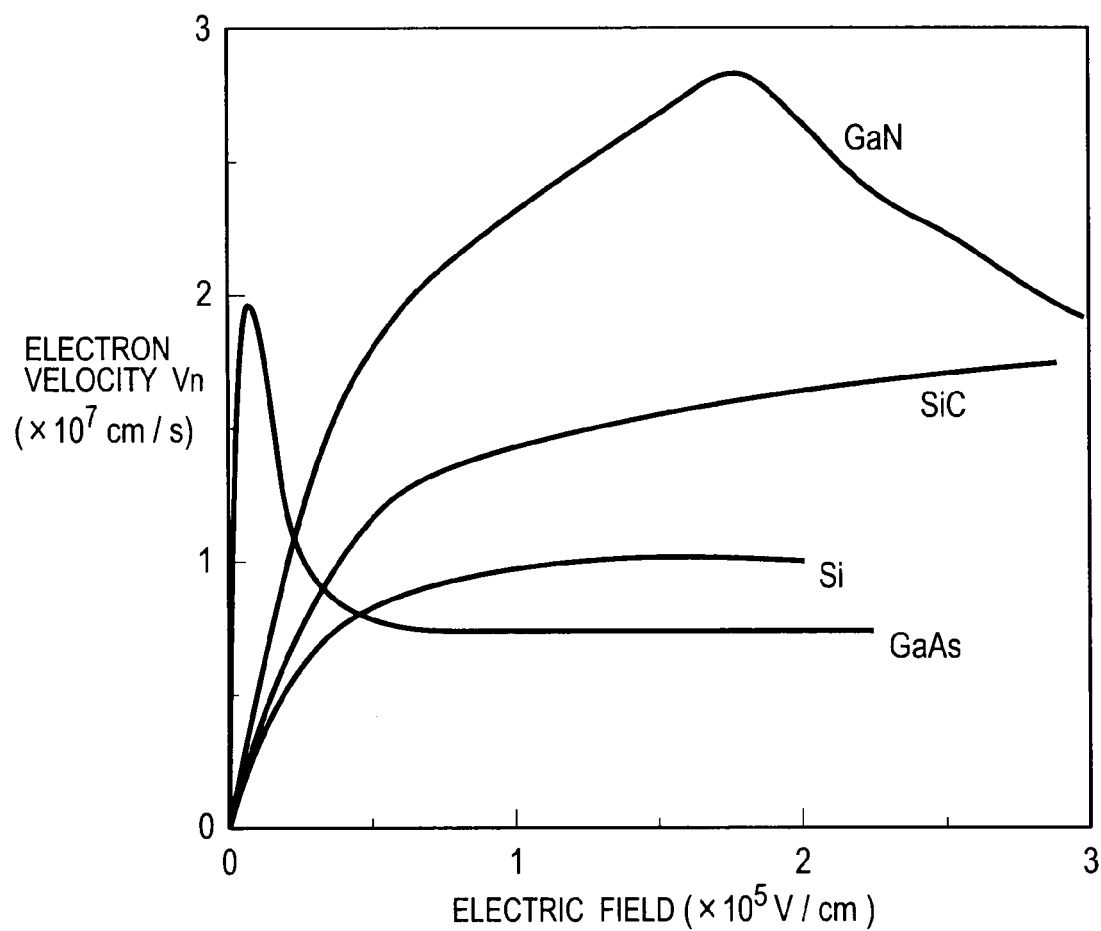
FIG. 4 shows an example of electrical conduction characteristics in GaN, and is a characteristics chart for explaining the electric field dependency of electron velocity.

FIG. 4 shows an example of electrical conduction characteristics in GaN, and a calculation result of the electric field dependency of electron velocity in GaN is shown as compared with Si and GaAs (J. D. Albrecht et al., J. Appl. Phys. 83, 4777 (1988)). As shown in FIG. 4, peak velocity is $2.8 \times 10^7$ $cm^2/V \cdot s$ at room temperature, and is about 1.5 times the GaAs. On the other hand, in GaN, an electric field (peak electric field) from which peak velocity is obtained is 180 kV/cm, and is far large as compared with several kV/cm of GaAs. This is because an energy gap between gamma valley of a conduction band and a satellite valley with heavy effective mass is 2.0 eV in GaN, and is large as compared with 0.33 eV of GaAs. Therefore, in GaN, although peak velocity is high, a peak electric field is also high. In addition, the relation between electron velocity and an electric field in the case of Si and SiC is also shown in FIG. 4.

In the semiconductor device according to the first embodiment of the present invention, in particular, a semiconducting material with a high electric field which reaches saturation electron velocity, such as GaN, is used, and width of an active area 30 between gate and source is set up more widely than width of an active area 32 between gate and drain in order to reduce channel resistance.

In the semiconductor device according to the first embodiment of the present invention, channel resistance of the active area 30 between gate and source placed between a source electrode 20 and a gate electrode 24 is reduced, and the semiconductor device has high frequency characteristics as the result.

Moreover, in the semiconductor device according to the first embodiment of the present invention, a semiconductor device which can alleviate electric field concentrations can be provided by reducing discontinuity of width of the active area 30 between source and gate and/or the active area 32 between drain and gate.

(Element Structure)

Figure 5A:
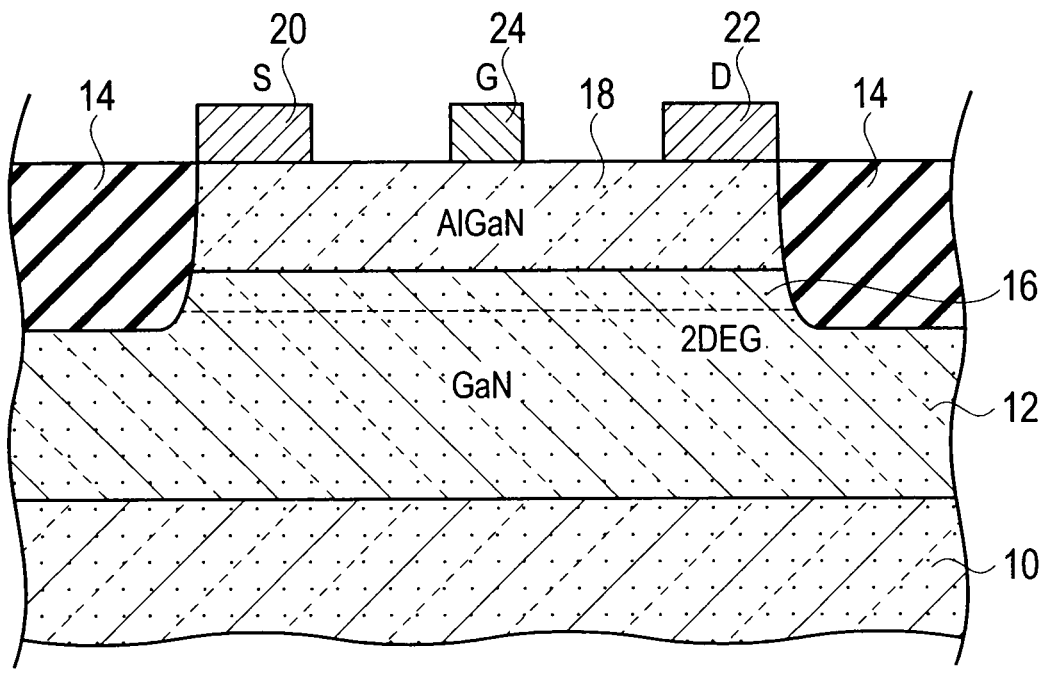
FIG. 5A shows a semiconductor device according to a first embodiment of the present invention, and is a schematic section structure chart.
Figure 5B:
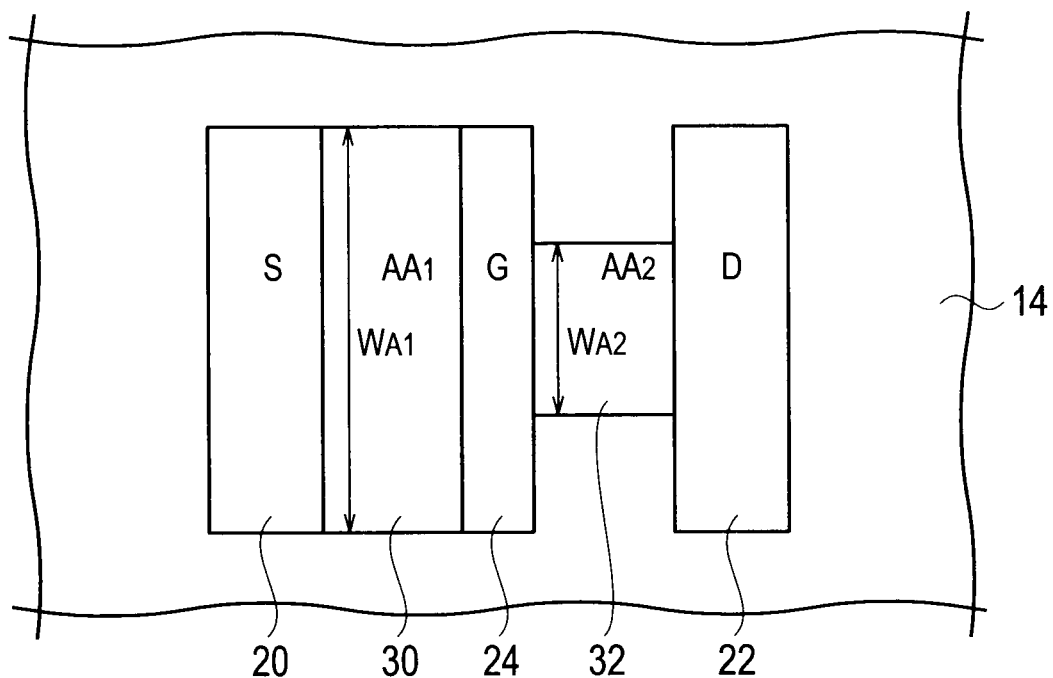
FIG. 5B shows the semiconductor device according to the first embodiment of the present invention, and is a schematic plane pattern configuration diagram.

FIG. 5 shows the semiconductor device according to the first embodiment of the present invention, FIG. 5A shows a schematic section structure chart, and FIG. 5B shows a schematic plane pattern configuration diagram.

As shown in FIG. 5A and FIG. 5B, the semiconductor device related to the first embodiment of the present invention includes: substrate regions (10, 12, 18); a gate electrode 24, a source electrode 20, and a drain electrode 22 which are placed on a first surface of the substrate regions (10, 12, 18); an active area 30 placed between the gate electrode 24 and the source electrode 20; an active area 32 placed between the gate electrode 24 and the drain electrode 22; an active area (not shown) placed on the substrate regions (10, 12, 18) of the underneath part of the gate electrode 24, the source electrode 20, and the drain electrode 22; and a non-active area (isolation region) 14 placed adjoining of the active area, the active area 30 between gate and source, and the active area 32 between gate and drain. Furthermore, width $W_{A1}$ of the active area 30 between gate and source is wider than width $W_{A2}$ of the active area 32 between gate and drain.

More specifically, as shown in FIG. 5A and FIG. 5B, the semiconductor device according to the first embodiment of the present invention includes: a substrate 10, a GaN epitaxial growth layer 12 placed on the substrate 10; an AlGaN layer 18 placed on the GaN epitaxial growth layer 12; a source electrode 20, a gate electrode 24, and a drain electrode 22 which are placed on the AlGaN layer 18; and a non-active area (isolation region) 14 formed in a part of the AlGaN layer 18 and the GaN epitaxial growth layer 12. Furthermore, the width $W_{A1}$ of the active area 30 between gate and source is wider than the width $W_{A2}$ of the active area 32 between gate and drain.

A 2DEG layer 16 is formed on an interface with the AlGaN layer 18 on the GaN epitaxial growth layer 12. The semiconductor device shown in FIG. 5 is equivalent to the HEMT.

As shown in FIG. 5A and FIG. 5B, in the semiconductor device according to the first embodiment of the present invention, in order to reduce a value of resistance of the source resistance Rs which is the channel resistance between the source electrode 20 and the gate electrode 24, the width $W_{A1}$ of the active area 30 ($AA_1$) between gate and source placed between the source electrode 20 and the gate electrode 24 is widely set up as compared with the width $W_{A2}$ of the active area 32 ($AA_2$) between gate and drain placed between the gate electrode 24 and the drain electrode 22.

As a result, in the semiconductor device according to the first embodiment of the present invention, the value of the mutual conductance gm increases, and excellent high frequency characteristics are obtained.

Moreover, in the semiconductor device according to the first embodiment of the present invention, by reducing the source resistance Rs, the ON resistance can be reduced and the rising characteristics of drain current $I_D$ can be improved, in drain current $I_D$ versus drain-source voltage $V_{DS}$ characteristics.

Therefore, in the semiconductor device according to the first embodiment of the present invention, a high frequency semiconductor device with high breakdown voltage and high current capability can be obtained.

Moreover, in the semiconductor device according to the first embodiment of the present invention, the following plane pattern configuration examples 1 to 7 are applicable as plane pattern configuration examples.

(Plane Pattern Configuration Example 1)

Figure 7:
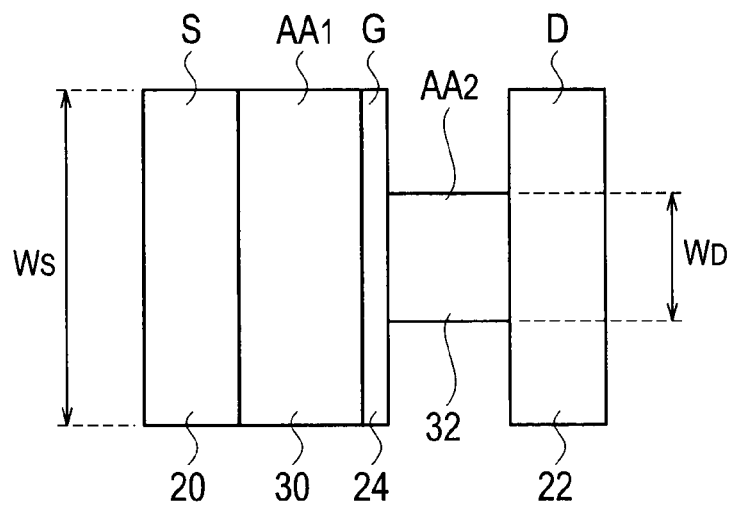
FIG. 7 is a schematic plane pattern chart of a configuration example 1, in the semiconductor device according to first and second embodiments of the present invention.

FIG. 7 shows a schematic plane pattern chart of a configuration example 1, and shows a schematic plane pattern chart corresponding to FIG. 5B, in the semiconductor device according to the first embodiment of the present invention. In the example of FIG. 7, the width $W_{A2}$ of the active area 32 between gate and drain is narrower than the width $W_{A1}$ of the active area 30 between gate and source, and the width $W_{A2}$ has definite width from the gate electrode 24 toward the drain electrode 22. In the example of FIG. 7, the width $W_S$ of the source region is equal to the width $W_{A1}$ of the active area 30 between gate and source. On the other hand, the width $W_D$ of the drain region is determined by the width $W_{A2}$ of the active area 32 between gate and drain.

(Plane Pattern Configuration Example 2)

Figure 8:
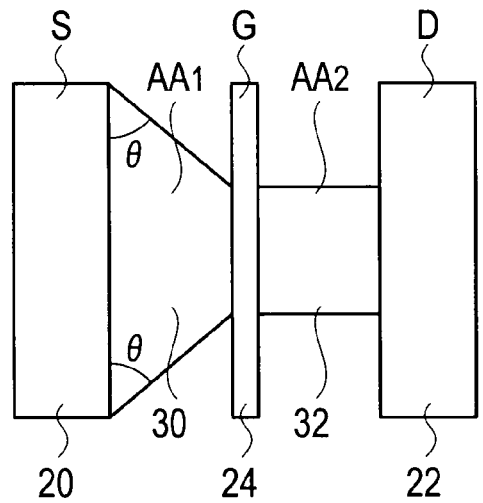
FIG. 8 is a schematic plane pattern chart of a configuration example 2, in the semiconductor device according to first and second embodiments of the present invention.

FIG. 8 shows a schematic plane pattern chart of the configuration example 2, in the semiconductor device according to the first embodiment of the present invention. In the example of FIG. 8, the width of the active area 30 between gate and source has a tapered form (taper angle θ) which becomes narrow linearly from the source electrode 20 toward the gate electrode 24. Moreover, in the example of FIG. 8, the width $W_{A2}$ of the active area 32 between gate and drain is narrower than the width $W_{A1}$ of the active area 30 between gate and source, and the width $W_{A2}$ of the active area 32 between gate and drain has definite width from the gate electrode 24 toward the drain electrode 22.

(Plane Pattern Configuration Example 3)

Figure 9:
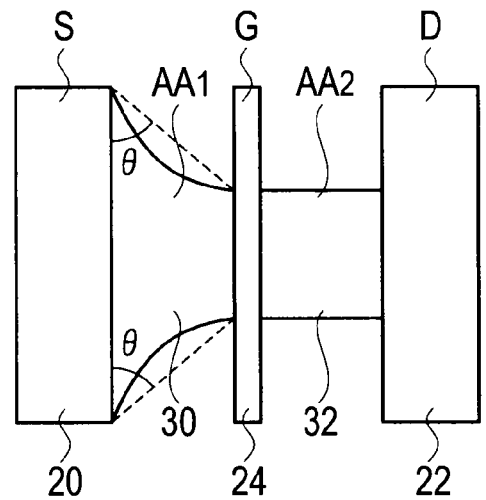
FIG. 9 is a schematic plane pattern chart of a configuration example 3, in the semiconductor device according to first and second embodiments of the present invention.

FIG. 9 shows a schematic plane pattern chart of the configuration example 3, in the semiconductor device according to the first embodiment of the present invention. In the example of FIG. 9, the width of the active area 30 between gate and source has a tapered form (taper angle smaller than the taper angle θ of FIG. 8) which becomes narrow rounded from the source electrode 20 toward the gate electrode 24. Moreover, in the example of FIG. 9, the width $W_{A2}$ of the active area 32 between gate and drain is narrower than the width $W_{A1}$ of the active area 30 between gate and source, and the width $W_{A2}$ of the active area 32 between gate and drain has definite width from the gate electrode 24 toward the drain electrode 22.

(Plane Pattern Configuration Example 4)

Figure 10:
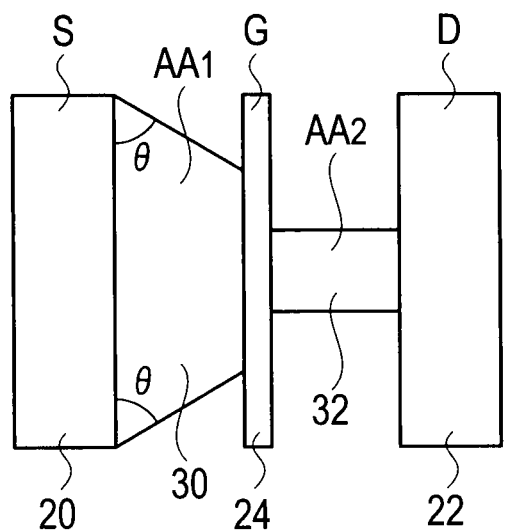
FIG. 10 is a schematic plane pattern chart of a configuration example 4, in the semiconductor device according to first and second embodiments of the present invention.

FIG. 10 shows a schematic plane pattern chart of the configuration example 4, in the semiconductor device according to the first embodiment of the present invention. In the example of FIG. 10, the width of the active area 30 between gate and source has a tapered form (taper angle θ) which becomes narrow linearly from the source electrode 20 toward the gate electrode 24. Moreover, in the example of FIG. 10, the width $W_{A2}$ of the active area 32 between gate and drain is narrower than the width $W_{A1}$ of the active area 30 between gate and source, and the width $W_{A2}$ of the active area 32 between gate and drain has definite width from the gate electrode 24 toward the drain electrode 22.

In the example of FIG. 10, the taper angle θ of FIG. 10 is larger than the taper angle of FIG. 8, as compared with the example of FIG. 8. Therefore, the width $W_{A1}$ of the active area 30 between gate and source of an edge of the gate electrode 24 is larger than the width $W_{A2}$ of the active area 32 between gate and drain of the definite width.

(Plane Pattern Configuration Example 5)

Figure 11:
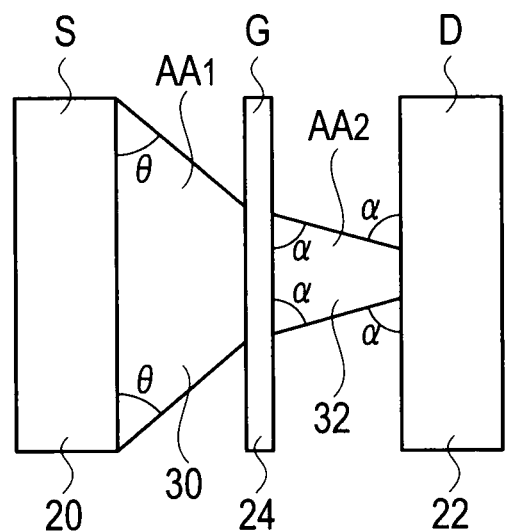
FIG. 11 is a schematic plane pattern chart of a configuration example 5, in the semiconductor device according to first and second embodiments of the present invention.

FIG. 11 shows a schematic plane pattern chart of the configuration example 5, in the semiconductor device according to the first embodiment of the present invention. In the example of FIG. 11, the width $W_{A1}$ of the active area 30 between gate and source has a tapered form (taper angle θ) which becomes narrow gradually from the source electrode 20 toward the gate electrode 24. Moreover, the width $W_{A2}$ of the active area 32 between gate and drain has a tapered form (taper angle α) which becomes narrow linearly from the gate electrode 24 toward the drain electrode 22.

(Plane Pattern Configuration Example 6)

Figure 12:
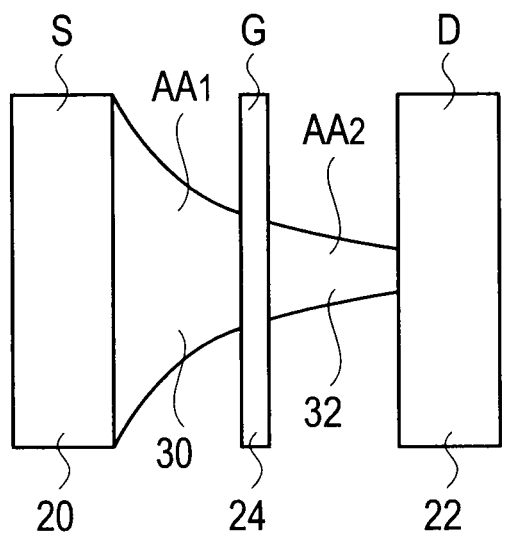
FIG. 12 is a schematic plane pattern chart of a configuration example 6, in the semiconductor device according to first and second embodiments of the present invention.

FIG. 12 shows a schematic plane pattern chart of the configuration example 6, in the semiconductor device according to the first embodiment of the present invention. In the example of FIG. 12, the width $W_{A1}$ of the active area 30 between gate and source has a tapered form which becomes narrow rounded from the source electrode 20 toward the gate electrode 24. Moreover, in the example of FIG. 12, the width $W_{A2}$ of the active area 32 between gate and drain has a tapered form which becomes narrow rounded from the gate electrode 24 toward the drain electrode 22.

(Plane Pattern Configuration Example 7)

Figure 13:
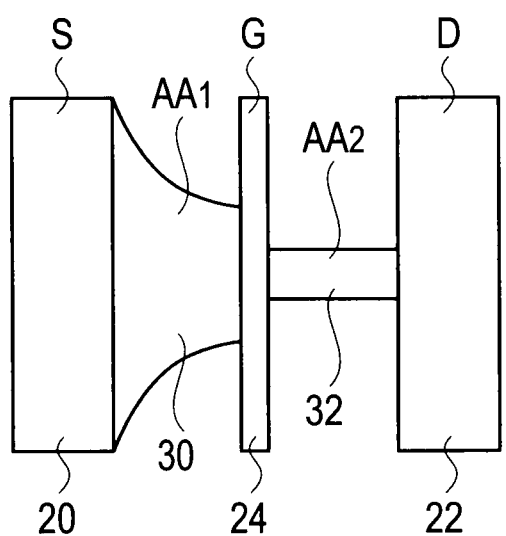
FIG. 13 is a schematic plane pattern chart of a configuration example 7, in the semiconductor device according to first and second embodiments of the present invention.

FIG. 13 shows a schematic plane pattern chart of the configuration example 7, in the semiconductor device according to the first embodiment of the present invention. In the example of FIG. 13, the width $W_{A1}$ of the active area 30 between gate and source has a tapered form which becomes narrow rounded from the source electrode 20 toward the gate electrode 24. Moreover, in the example of FIG. 13, the width $W_{A2}$ of the active area 32 between gate and drain is narrower than the width $W_{A1}$ of the active area 30 between gate and source, and the width $W_{A2}$ of the active area 32 between gate and drain has definite width from the gate electrode 24 toward the drain electrode 22.

In an example of FIG. 13, the width $W_{A1}$ of the active area 30 between gate and source of an edge of the gate electrode 24 is larger than the width $W_{A2}$ of the active area 32 between gate and drain of definite width as compared with the example of FIG. 9.

(Plane Pattern Configuration Example 8)

Figure 14:
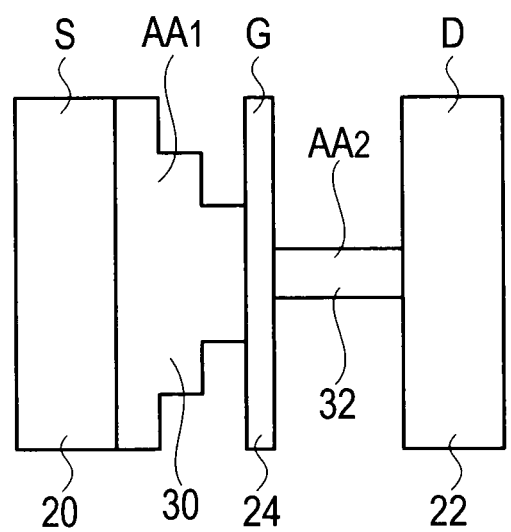
FIG. 14 is a schematic plane pattern chart of a configuration example 8, in the semiconductor device according to first and second embodiments of the present invention.

FIG. 14 shows a schematic plane pattern chart of the configuration example 8, in the semiconductor device according to the first embodiment of the present invention. In the example of FIG. 14, the width $W_{A1}$ of the active area 30 between gate and source has a shape which becomes narrow stair-like from the source electrode 20 toward the gate electrode 24.

In the example of FIG. 14, the width $W_{A1}$ of the active area 30 between gate and source of an edge of the gate electrode 24 is larger than the width $W_{A2}$ of the active area 32 between gate and drain of definite width, as well as FIG. 13.

According to the semiconductor device according to the first embodiment of the present invention, a semiconductor device which can suppress an increase in channel resistance can be provided.

Moreover, according to the semiconductor device according to the first embodiment of the present invention, channel resistance of the active area between source and gate placed between the gate electrode and the source electrode is reduced, and as the result, a semiconductor device which has high frequency characteristics can be provided.

Moreover, according to the semiconductor device according to the first embodiment of the present invention, a semiconductor device which can alleviate electric field concentrations can be provided by reducing discontinuity of width of the active area 30 between source and gate and/or the active area 32 between drain and gate.

Second Embodiment

Element Structure

Figure 6A:
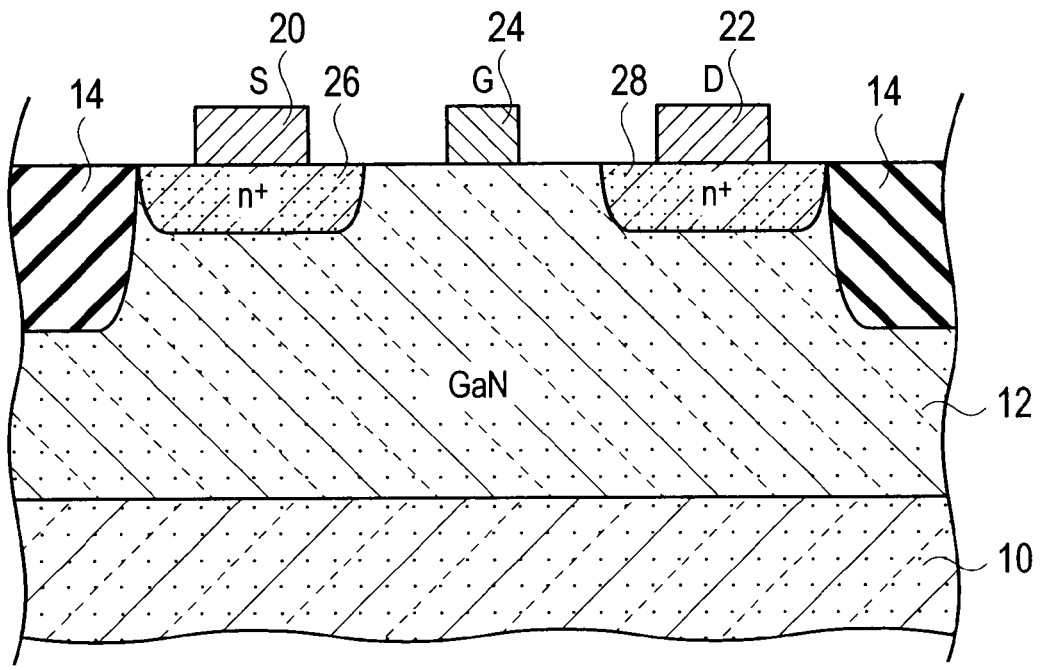
FIG. 6A shows a semiconductor device according to a second embodiment of the present invention, and is a schematic section structure chart.
Figure 6B:
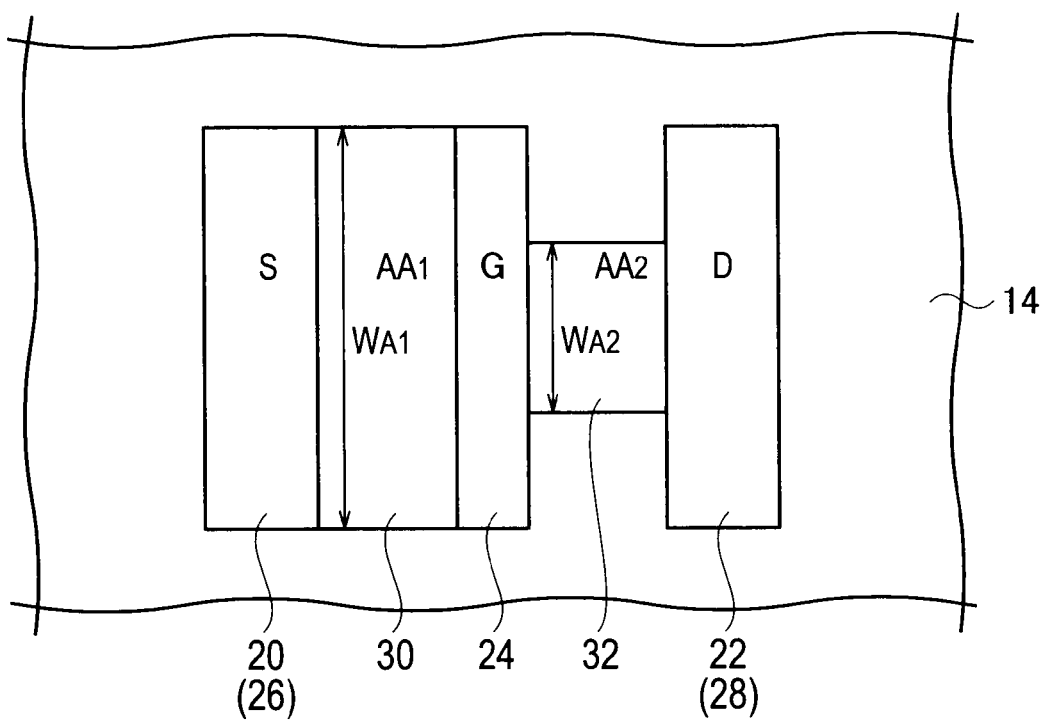
FIG. 6B shows the semiconductor device according to the second embodiment of the present invention, and is a schematic plane pattern configuration diagram.

FIG. 6 shows the semiconductor device according to the second embodiment of the present invention, FIG. 6A shows a schematic section structure chart, and FIG. 6B shows a schematic plane pattern configuration diagram.

As shown in FIG. 6A and FIG. 6B, the semiconductor device according to the second embodiment of the present invention includes: substrate regions (10, 12); a source region 26 and a drain region 28 which are placed on a first surface of the substrate regions (10, 12); a gate electrode 24 placed on the first surface of the substrate regions (10, 12); a source electrode 20 placed on the source region 26, and a drain electrode 22 placed on the drain region 28; an active area 30 between gate and source placed between the gate electrode 24 and the source electrode 20; an active area 32 between gate and drain placed between the gate electrode 24 and the drain electrode 22; an active area (not shown) placed on the substrate regions (10, 12) of the underneath part of the gate electrode 24, the source electrode 20, and the drain electrode 22; and a non-active area (isolation region) 14 placed adjoining of the active area, the active area 30 between gate and source, and the active area 32 between gate and drain. Furthermore, width WA1 of the active area 30 between gate and source is wider than width WA2 of the active area 32 between gate and drain.

More specifically, as shown in FIG. 6A and FIG. 6B, the semiconductor device according to the second embodiment of the present invention includes: a substrate 10; a GaN epitaxial growth layer 12 placed on the substrate 10; a source region 26 and a drain region 28 which are placed on the GaN epitaxial growth layer 12; a source electrode 20 placed on the source region 26, a gate electrode 24 placed on the GaN epitaxial growth layer 12, and a drain electrode 22 placed on the drain region 28; and a non-active area (isolation region) 14 formed on a part of the GaN epitaxial growth layer 12. The Schottky contact is formed on an interface of the GaN epitaxial growth layer 12 and the gate electrode 24. MESFET (Metal Semiconductor Field Effect Transistor) is composed in the semiconductor device shown in FIG. 5.

As shown in FIG. 6A and FIG. 6B, in the semiconductor device according to the second embodiment of the present invention, in order to reduce a value of resistance of the source resistance Rs which is the channel resistance between the source electrode 20 and the gate electrode 24, the width $W_{A1}$ of the active area 30 ($AA_1$) between gate and source placed between the source electrode 20 and the gate electrode 24 is widely set up as compared with the width $W_{A2}$ of the active area 32 ($AA_2$) between gate and drain placed between the gate electrode 24 and the drain electrode 22. By reducing the value of the source resistance Rs, the value of voltage applied between the gate electrode 24 and the source electrode 20 can be made relatively low. The value of the electron velocity is easy to reach the peak value of the electron velocity due to the peak electric field by applying relatively low voltage between the gate electrode 24 and the source electrode 20.

As a result, in the semiconductor device according to the second embodiment of the present invention, the mutual conductance gm increases, and excellent high frequency characteristics are obtained.

Moreover, in the semiconductor device according to the second embodiment of the present invention, by reducing the source resistance Rs, the ON resistance can be reduced and the rising characteristics of drain current $I_D$ can be improved, in drain current $I_D$ versus drain-source voltage $V_{DS}$ characteristics.

Therefore, in the semiconductor device according to the second embodiment of the present invention, a high frequency semiconductor device with high breakdown voltage and high current capability can be obtained.

Moreover, also in the semiconductor device according to the second embodiment of the present invention, the plane pattern configuration examples 1 to 7 explained in the first embodiment as the plane pattern configuration examples are applicable.

According to the semiconductor device according to the second embodiment of the present invention, a semiconductor device which can suppress an increase in channel resistance can be provided.

Moreover, according to the semiconductor device according to the second embodiment of the present invention, channel resistance of the active area between source and gate placed between the gate electrode and the source electrode is reduced, and as the result, a semiconductor device which has high frequency characteristics can be provided.

Moreover, according to the semiconductor device according to the second embodiment of the present invention, a semiconductor device which ca alleviate electric field concentrations can be provided by reducing discontinuity of width of the active area between source and gate and/or the active area between drain and gate.

Third Embodiment

Figure 15A:
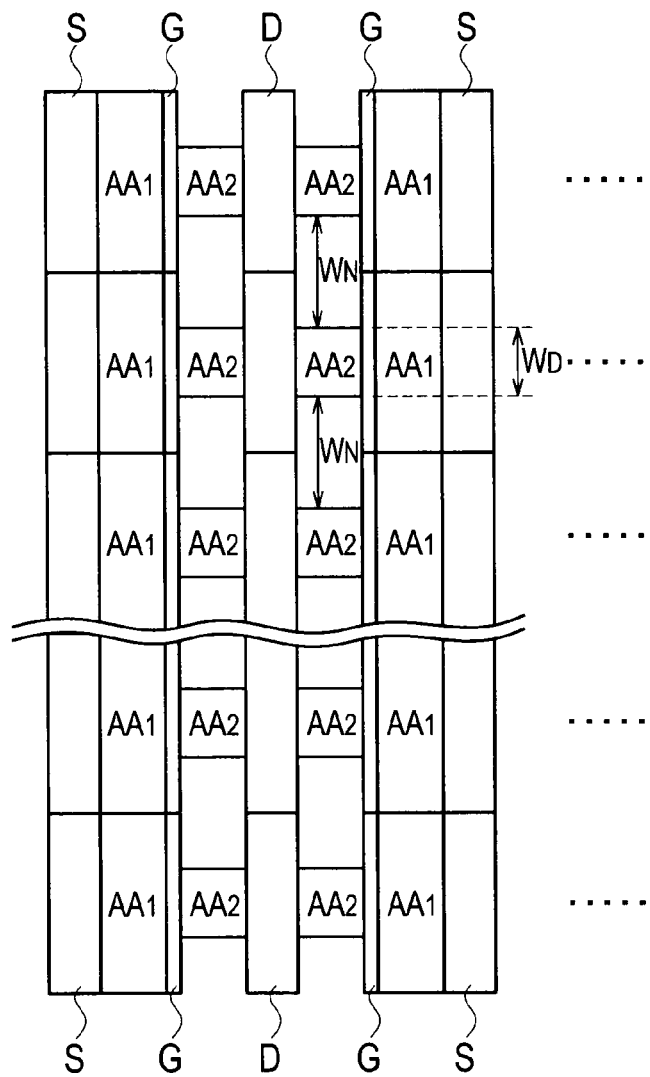
FIG. 15A shows a semiconductor device according to a third embodiment of the present invention, and is a schematic plane pattern configuration diagram showing a semiconductor device which extends channel width and is turned up in the direction of a source electrode centering on a drain electrode.
Figure 15B:
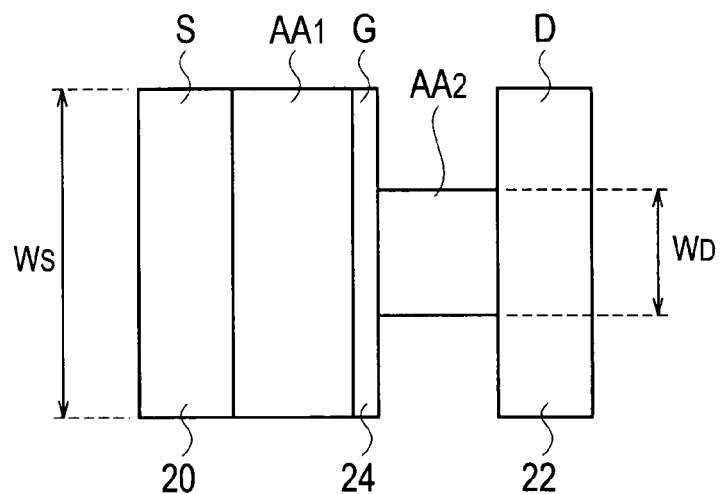
FIG. 15B shows a semiconductor device according to the third embodiment of the present invention, and is a schematic plane pattern configuration diagram showing an enlarged unit element.

FIG. 15 shows a semiconductor device according to a third embodiment of the present invention, FIG. 15A shows a schematic plane pattern configuration diagram of a semiconductor device placing a unit element to m pieces in parallel to extend channel width, and turned up placement of the source electrode 20 and the gate electrode 24 centering on the drain electrode 22, and FIG. 15B shows an enlarged schematic plane pattern configuration diagram of the unit element.

Also in the semiconductor device according to the third embodiment of the present invention, it can be applied for the fundamental element structure, such as HEMT which is the semiconductor device according to the first embodiment, or MESFET which is the semiconductor device according to the second embodiment.

The enlarged schematic plane pattern configuration of the unit element shown in FIG. 15B is the same as the schematic plane pattern configuration of FIG. 5B or FIG. 7.

(Example of Placement of Plane Pattern Structure)

In FIG. 15A, width $W_N$ of the non-active area between gate and drain is also shown. In FIG. 15A, width $W_D$ of the drain region is equal to width $W_{A2}$ of the active area 32 between gate and drain ($AA_2$). Moreover, a relation of $W_N=2\times W_D$ is satisfied. Furthermore, a relation of width of the source region $W_S=W_N+W_D$ is satisfied. Therefore, the width $W_S=W_N+W_D=2\times W_D+W_D=3\times W_D$ is satisfied.

According to the semiconductor device according to the third embodiment of the present invention, a semiconductor device of multi-channel structure can be obtained by placing the unit element to m pieces in parallel to extend the channel width, and applying as a plane pattern which turned up placement of the source electrode 20 and the gate electrode 24 centering on the drain electrode 22.

According to the semiconductor device according to the third embodiment of the present invention, current capacity 2×m times the current capacity of the unit element can be obtained.

According to the semiconductor device according to the third embodiment of the present invention, a semiconductor device of multi-channel structure which can suppress an increase in channel resistance can be provided.

Moreover, according to the semiconductor device according to the third embodiment of the present invention, channel resistance of the active area 30 between source and gate placed between the gate electrode from the source electrode is reduced, and as the result, a semiconductor device which has high frequency characteristics can be provided.

Fourth Embodiment

Figure 16A:
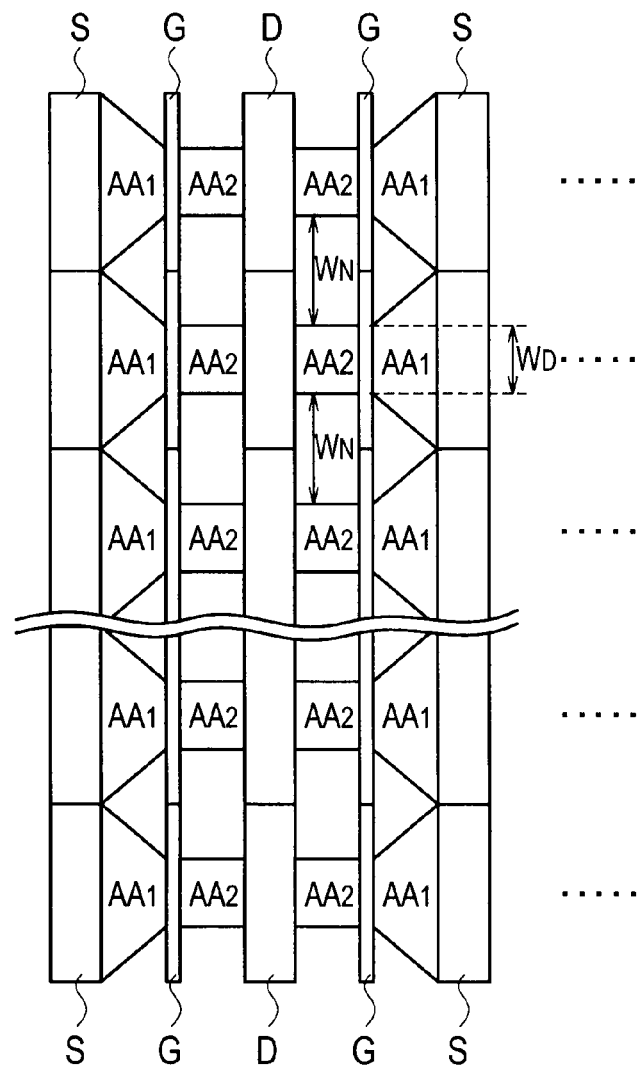
FIG. 16A shows a semiconductor device according to a fourth embodiment of the present invention, and is a schematic plane pattern configuration diagram showing a semiconductor device which extends channel width and is turned up in the direction of a source electrode centering on a drain electrode.
Figure 16B:
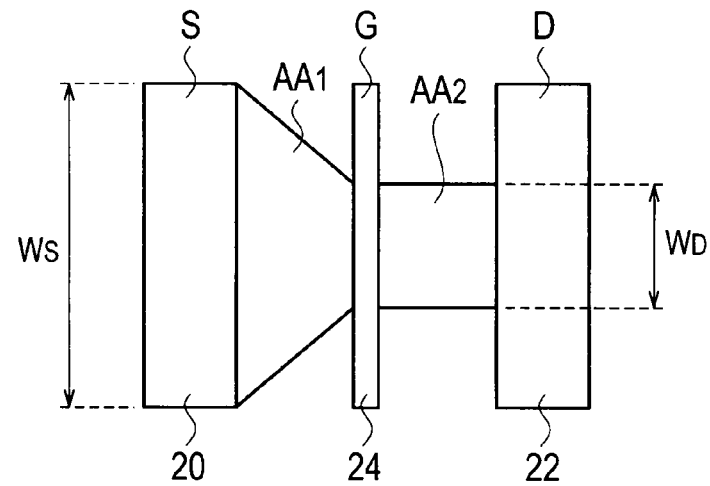
FIG. 16B shows a semiconductor device according to the fourth embodiment of the present invention, and is a schematic plane pattern configuration diagram showing an enlarged unit element.

FIG. 16 shows a semiconductor device according to a fourth embodiment of the present invention, FIG. 16A shows a schematic plane pattern configuration diagram of a semiconductor device placing a unit element to m pieces in parallel to extend channel width, and turned up placement of the source electrode 20 and the gate electrode 24 centering on the drain electrode 22, and FIG. 16B shows an enlarged schematic plane pattern configuration diagram of the unit element.

Also in the semiconductor device according to the fourth embodiment of the present invention, it can be applied for the fundamental element structure, such as HEMT which is the semiconductor device according to the first embodiment, or MESFET which is the semiconductor device according to the second embodiment.

The enlarged schematic plane pattern configuration of the unit element shown in FIG. 16B is the same as the plane pattern configuration example 2 (FIG. 8) of the semiconductor device according to the first embodiment.

(Example of Placement of Plane Pattern Structure)

In FIG. 16A, width $W_N$ of the non-active area between gate and drain is also shown. In FIG. 16A, width $W_D$ of the drain region is equal to width $W_{A2}$ of the active area 32 between gate and drain ($AA_2$). Moreover, a relation of $W_N=2\times W_D$ is satisfied. Furthermore, a relation of width of the source region $W_S=W_N+W_D$ is satisfied. Therefore, the width $W_S=W_N+W_D=2\times W_D+W_D=3\times W_D$ is satisfied.

According to the semiconductor device according to the fourth embodiment of the present invention, a semiconductor device of multi-channel structure can be obtained by placing the unit element to m pieces in parallel to extend the channel width, and applying as a plane pattern which turned up placement of the source electrode 20 and the gate electrode 24 centering on the drain electrode 22.

According to the semiconductor device according to the fourth embodiment of the present invention, current capacity 2×m times the current capacity of the unit element can be obtained.

According to the semiconductor device according to the fourth embodiment of the present invention, a semiconductor device of multi-channel structure which can suppress an increase in channel resistance can be provided.

Moreover, according to the semiconductor device according to the fourth embodiment of the present invention, channel resistance of the active area 30 between source and gate placed between the gate electrode from the source electrode is reduced, and as the result, a semiconductor device which has high frequency characteristics can be provided.

Moreover, according to the semiconductor device according to the fourth embodiment of the present invention, a semiconductor device of multi-channel structure which can alleviate electric field concentrations can be provided by reducing discontinuity of width of the active area between source and gate and/or the active area between drain and gate.

Fifth Embodiment

Figure 17A:
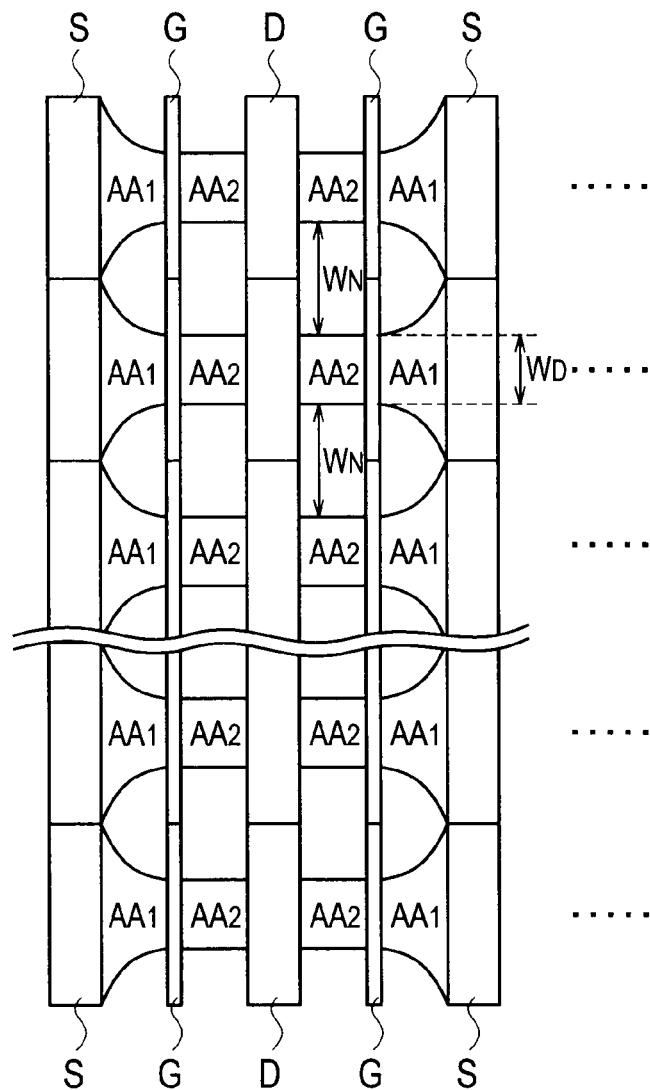
FIG. 17A shows a semiconductor device according to a fifth embodiment of the present invention, and is a schematic plane pattern configuration diagram showing a semiconductor device which extends channel width and is turned up in the direction of a source electrode centering on a drain electrode.
Figure 17B:
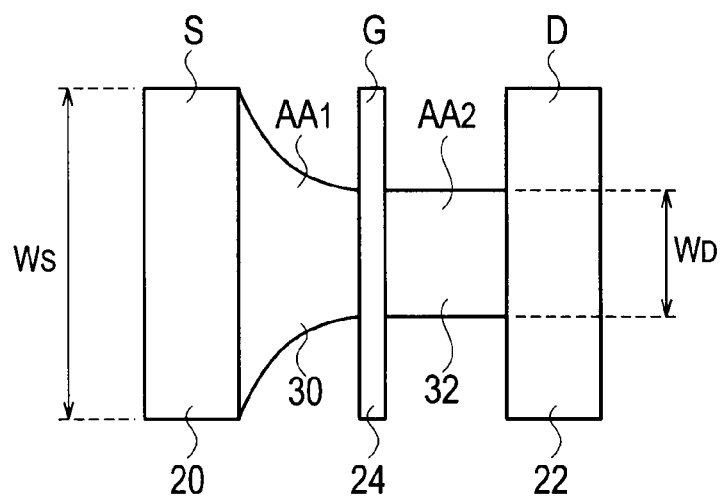
FIG. 17B shows a semiconductor device according to the fifth embodiment of the present invention, and is a schematic plane pattern configuration diagram showing an enlarged unit element.

FIG. 17 shows a semiconductor device according to a fifth embodiment of the present invention, FIG. 17A shows a schematic plane pattern configuration diagram of a semiconductor device placing a unit element to m pieces in parallel to extend channel width, and turned up placement of the source electrode 20 and the gate electrode 24 centering on the drain electrode 22, and FIG. 17B shows an enlarged schematic plane pattern configuration diagram of the unit element.

Also in the semiconductor device according to the fifth embodiment of the present invention, it can be applied for the fundamental element structure, such as HEMT which is the semiconductor device according to the first embodiment, or MESFET which is the semiconductor device according to the second embodiment.

The enlarged schematic plane pattern configuration of the unit element shown in FIG. 17B is the same as the plane pattern configuration example 3 (FIG. 9) of the semiconductor device according to the first embodiment.

(Example of Placement of Plane Pattern Structure)

In FIG. 17A, width $W_N$ of the non-active area between gate and drain is also shown. In FIG. 17A, width $W_D$ of the drain region is equal to width $W_{A2}$ of the active area 32 between gate and drain ($AA_2$). Moreover, a relation of $W_N=2\times W_D$ is satisfied. Furthermore, a relation of width of the source region $W_S=W_N+W_D$ is satisfied. Therefore, the width $W_S=W_N+W_D=2\times W_D+W_D=3\times W_D$ is satisfied.

According to the semiconductor device according to the fifth embodiment of the present invention, a semiconductor device of multi-channel structure can be obtained by placing the unit element to m pieces in parallel to extend the channel width, and applying as a plane pattern which turned up placement of the source electrode 20 and the gate electrode 24 centering on the drain electrode 22.

Figure 18A:
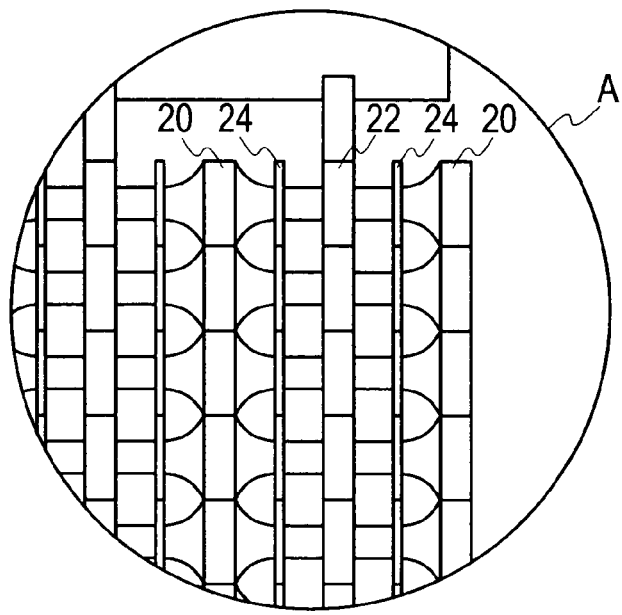
FIG. 18A shows an overall schematic plane pattern configuration of the semiconductor device according to the fifth embodiment of the present invention, and is an enlarged drawing showing a part of reference symbol A of FIG. 18B.
Figure 18B:
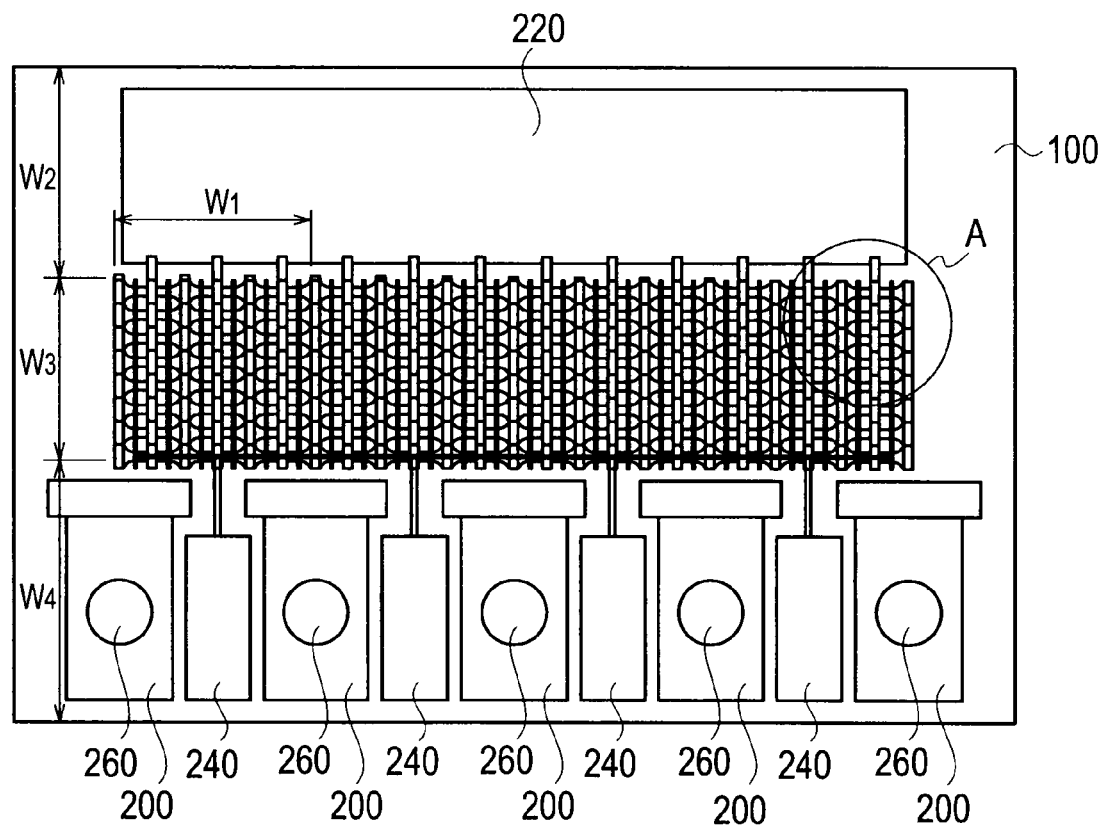
FIG. 18B shows an overall schematic plane pattern configuration of the semiconductor device according to the fifth embodiment of the present invention, and is an overall schematic plane pattern configuration diagram.

Moreover, FIG. 18 shows a schematic plane pattern configuration of the semiconductor device according to the fifth embodiment of the present invention, FIG. 18A shows an enlarged drawing of a part of reference numeral A of FIG. 18B, and FIG. 18B shows an overall schematic plane pattern configuration diagram.

As shown in FIG. 18, the overall schematic plane pattern configuration of the semiconductor device according to the conventional example includes: a substrate 100; a gate electrode 24, a source electrode 20, and a drain electrode 22 which are placed on a first surface of the substrate 100 and have a plurality of fingers, respectively; a gate terminal electrode 240, a source terminal electrode 200, and a drain terminal electrode 220 which are placed on the first surface of the substrate 100, and make bundles of a plurality of fingers and are formed, respectively every the gate electrode 24, the source electrode 20, and the drain electrode 22; an active area 30 between gate and source placed between the gate electrode 24 and the source electrode 20; an active area 32 between gate and drain placed between the gate electrode 24 and the drain electrode 22; and a VIA hole 260 connected to the source terminal electrode 200, wherein width of the active area 30 between gate and source is wider than the width of the active area 32 between gate and drain.

In a configuration example of FIG. 18, as for the size of each part, for example, cell width W1 is about 120 micrometers, W2 is about 80 micrometers, cell length W3 is about 100 micrometers, W4 is about 120 micrometers, and gate width WG is about 2.4 mm (=100 micrometer×6×4 cells) as a whole.

In the example of FIG. 18, in the source terminal electrodes 200, the VIA holes 260 are formed from a backside of the substrate 100, and a ground conductor is formed on the backside of the substrate 100. And, when grounding the circuit element, the circuit element provided on the substrate 100 and the ground conductor formed on the backside of the substrate 100 are electrically connected through the VIA holes 260 which pass through the substrate 100.

In addition, the gate terminal electrodes 240 are connected to surrounding semiconductor chips by bonding wires etc., and the drain terminal electrode 220 is also connected to surrounding semiconductor chips by bonding wires etc.

According to the semiconductor device according to the fifth embodiment of the present invention, current capacity 2×m times the current capacity of the unit element can be obtained.

According to the semiconductor device according to the fifth embodiment of the present invention, a semiconductor device of multi-channel structure which can suppress an increase in channel resistance can be provided.

Moreover, according to the semiconductor device according to the fifth embodiment of the present invention, channel resistance of the active area between source and gate placed between the gate electrode and the source electrode is reduced, and as the result, a semiconductor device which has high frequency characteristics can be provided.

Moreover, according to the semiconductor device according to the fifth embodiment of the present invention, a semiconductor device of multi-channel structure which can alleviate electric field concentrations can be provided by reducing discontinuity of width of the active area between source and gate and/or the active area between drain and gate.

Other Embodiments

While the present invention is described in accordance with the aforementioned embodiments, it should not be understood that the description and drawings that configure part of this disclosure are to limit the present invention. This disclosure makes clear a variety of alternative embodiments, working examples, and operational techniques for those skilled in the art.

In addition, it cannot be overemphasized that the amplifying elements are applicable not only to MESFET, HEMT but also other amplifying elements, such as LDMOS (Lateral Doped Metal-Oxide-Semiconductor) FET, and HBT (Hetero-junction Bipolar Transistor).

Moreover, it is also clear that a semiconductor device of multi-channel structure can be provided by applying the unit element shown in the plane pattern configuration example 4 to the configuration example 7 (FIG. 10 to FIG. 13) of the semiconductor device according to the first embodiment into an elemental base unit, as well as the third to fourth embodiments.

Moreover, the semiconductor device according to the third to fourth embodiments realizable as an overall schematic plane pattern configuration as well as the fifth embodiment (FIG. 18B) is also clear.

It is clear that the semiconductor device of multi-channel structure is also realizable as an overall schematic plane pattern configuration as well as the fifth embodiment (FIG. 18B), by applying the unit element shown in the plane pattern configuration example 4 to the configuration example 8 (FIG. 10 to FIG. 14) of the semiconductor device according to the first embodiment into a base unit.

Moreover, the substrate region may be provided with either a SiC substrate, a GaN substrate, a substrate in which a GaN epitaxial layer is formed on a SiC substrate, a substrate in which a GaN epitaxial layer is formed on an Si substrate, a substrate in which a heterojunction epitaxial layer composed of GaN/GaAlN is formed on a SiC substrate, a substrate in which a GaN epitaxial layer is formed on a sapphire substrate, a sapphire substrate or a diamond substrate.

Accordingly, the technical scope of the present invention is defined by the claims that appear appropriate from the above explanation, as well as by the spirit of the invention. Various modifications will become possible for those skilled in the art after receiving the teachings of the present disclosure without departing from the scope thereof.

INDUSTRIAL APPLICABILITY

The semiconductor device of the present invention is applied to a semiconductor device which has a SiC substrate or a GaN wafer substrate, and has wide industrial application fields, such as a power amplifier element with internal matching circuits, an electric power MMIC (Monolithic Microwave Integrated Circuit), a microwave power amplifier, and a millimeter wave power amplifier.

What is claimed is:

1. A semiconductor device comprising:
   a substrate region;
   a gate electrode, a source electrode and a drain electrode which are placed on a first surface of the substrate region;
   an active area between gate and source placed between the gate electrode and the source electrode, the active area between gate and source placed along long-side directions of the gate electrode and the source electrode;
   an active area between gate and drain placed between the gate electrode and the drain electrode, the active area between gate and drain placed along long-side directions of the gate electrode and the drain electrode;
   an active area placed on the substrate region of an underneath part of the gate electrode, the source electrode, and the drain electrode; and
   a non-active area placed adjoining the active area, the active area between gate and source, and the active area between gate and drain, wherein
   a largest width along the long-side directions of the gate electrode and the source electrode of the active area between gate and source is wider than a largest width along the long-side directions of the gate electrode and the drain electrode of the active area between gate and drain, wherein
   the largest width along the long-side directions of the gate electrode and the source electrode of the active area between gate and source is respectively equal to a width along the long-side direction of the source electrode, a width along the long-side direction of the gate electrode, and a width along the long-side direction of the drain electrode.

2. The semiconductor device according to claim 1, wherein the width of the active area between gate and source has a tapered form to which the width becomes narrow linearly from the source electrode toward the gate electrode.

3. The semiconductor device according to claim 1, wherein the width of the active area between gate and source has a tapered form to which the width becomes narrow gradually from the source electrode toward the gate electrode.

4. The semiconductor device according to claim 1, wherein the width of the active area between gate and source has a tapered form to which the width becomes narrow rounded from the source electrode toward the gate electrode.

5. The semiconductor device according to claim 1, wherein the width along the long-side directions of the gate electrode and the drain electrode of the active area between gate and drain has definite width from the gate electrode toward the drain electrode.

6. The semiconductor device according to claim 1, wherein the width of the active area between gate and drain has a tapered form to which the width becomes narrow linearly from the gate electrode toward the drain electrode.

7. The semiconductor device according to claim 1, wherein the width of the active area between gate and drain has a tapered form to which the width becomes narrow rounded from the gate electrode toward the drain electrode.

8. The semiconductor device according to claim 1, further comprising:
   a plurality of unit cells having a plane pattern form which turns up the gate electrode and the source electrode centering on the drain electrode, wherein a channel width of the semiconductor device is expanded by the parallel arrangement of the plurality of unit cells.

9. The semiconductor device according to claim 1, wherein the substrate region includes a heterojunction epitaxial layer composed of GaN/AlGaN.

10. The semiconductor device according to claim 1, wherein
    the substrate region includes a GaN epitaxial layer, and
    the active area placed on the substrate region of the underneath part of the source electrode and the drain electrode is composed of a source diffusion region and a drain diffusion region, respectively.

11. The semiconductor device according to claim 1, wherein
    the substrate region has one of a SiC substrate, a GaN substrate, a substrate in which a GaN epitaxial layer is formed on a SiC substrate, a substrate in which a GaN epitaxial layer is formed on an Si substrate, a substrate in which a heterojunction epitaxial layer composed of GaN/AlGaN is formed on a SiC substrate, a substrate in which a GaN epitaxial layer is formed on a sapphire substrate, a sapphire substrate, and a diamond substrate.

12. The semiconductor device according to claim 1, comprising:
- the gate electrode, the source electrode, and the drain electrode having a plurality of fingers, respectively; and
- a gate terminal electrode, a source terminal electrode, and a drain terminal electrode which are placed on the first surface of the substrate region, and make bundles of a plurality of fingers and are formed, respectively for every the gate electrode, the source electrode, and the drain electrode.

* * * * *